Aug. 3, 1965 R. PERETZ 3,199,041
D.C. TRANSISTOR AMPLIFIER INCLUDING A ZENER DIODE
Filed Oct. 23, 1962
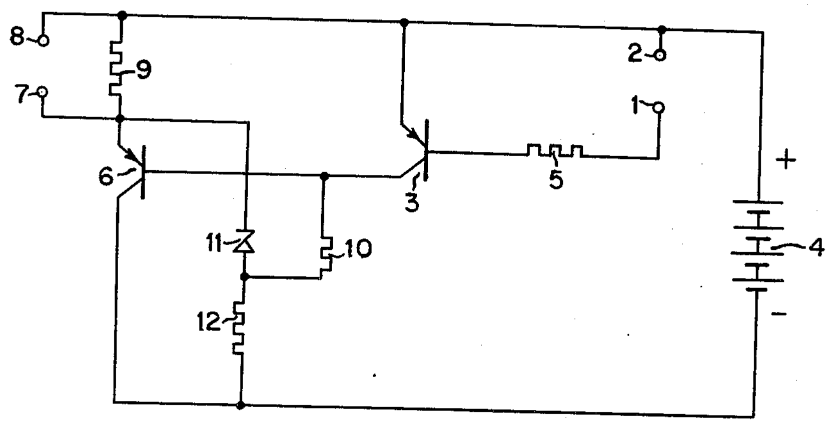
INVENTOR
Richard PERETZ
BY [signature]
ATTORNEYS United States Patent Office 3,199,041
Patented Aug. 3, 1965

3,199,041
D.C. TRANSISTOR AMPLIFIER INCLUDING A ZENER DIODE

Richard Peretz, Watermael-Boitsfort, Belgium, assignor to Ateliers de Constructions Electriques de Charleroi (ACEC), Brussels, Belgium, a joint-stock company of Belgium Filed Oct. 23, 1962, Ser. No. 232,537
1 Claim. (Cl. 330—19)

The present invention relates to a transistor amplifier of a new type which offers, over known amplifiers, considerable advantages.

One of the objects of the invention resides in the provision of a transistor amplifier having a very high gain in a single stage.

Another object of the invention consists in providing a transistor amplifier having a low output impedance and a high input impedance. A further object resides in a transistor amplifier of little sensitivity to power supply voltage variations.

The amplifier according to the invention is characterized in that it comprises a first transistor receiving an input signal in its emitter-base circuit and a second transistor, mounted in emitter-follower, supplying the output signal across the terminals of its emitter resistance and the base of which is connected to the collector of the first transistor; a Zener diode connected to the emitter of the second transistor and to the voltage feed end of the collector resistance of the first transistor in such a way that the current through the said collector resistance is constant.

The invention will be better understood by the description that follows having reference to the annexed drawing which illustrates the electrical diagram of an amplifier according to the invention.

The input terminals 1 and 2 are connected respectively to the base and to the emitter of a transistor 3 fed by D.C. voltage source 4. Terminal 1 is in series with resistance 5.

A second transistor 6 has its base connected to the collector of transistor 3 and is mounted in emitter-follower, the output terminals 7 and 8 of the amplifier being connected across resistance 9 of its emitter.

The collector of transistor 3 is connected to the voltage source, through a resistance 10, by means of a voltage divider comprising a Zener diode 11 joined, on the one hand, to the emitter of transistor 6 and, on the other hand, to the negative pole of the source 4 through a resistance 12.

The Zener diode 11 forces a constant potential across resistance 10 and, therefore, a constant current through the said resistance. Consequently, variations in the collector current of transistor 3 are entirely carried into the base-emitter circuit of transistor 6 wherefrom a very high gain is obtained. The transistor 6 operating in emitter-follower, the output impedance of the amplifier is small as is usual with this type of operation. As to the input impedance of the amplifier, it depends particularly on resistance 5 to which a very high value may be given which is practically equal to the product of the equivalent input resistance and the current gain in the stage.

Finally, the operation of the amplifier is practically unaffected by eventual variations in the power supply voltage on account of the well known stabilizing properties of the Zener diode and of the emitter-follower arrangement. The above described example related to an amplifier provided with pnp transistors but it is obvious that the invention may also apply to the cases of npn transistors. It is possible to make various changes to the above described amplifier or to utilize it in combination with other amplifiers of the same or different types without departing from the spirit of the instant invention.

I claim:

A high gain transistor amplifier fed by a D.C. voltage source, comprising in combination:

(a) a first and a second transistor;
(b) the collector of said first transistor directly connected to the base of said second transistor;
(c) an emitter load resistance for said second transistor;
(d) a feeding resistance connected to said D.C. voltage source;
(e) a Zener diode connected between the emitter of said second transistor and said feeding resistance;
(f) a collector resistance for said first transistor connected to the common point of said Zener diode and feeding resistance.

References Cited by the Examiner

UNITED STATES PATENTS

| | | | |
|---|---|---|---|
| 2,854,606 | 9/58 | Spiegel. | |
| 3,130,329 | 4/64 | Cother | 330—24 X |

ROY LAKE, *Primary Examiner.*

NATHAN KAUFMAN, *Examiner.*